(12) United States Patent
Chandrasekhar et al.

(10) Patent No.: US 11,251,129 B2
(45) Date of Patent: Feb. 15, 2022

(54) DEPOSITION OF GRAPHENE ON A DIELECTRIC SURFACE FOR NEXT GENERATION INTERCONNECTS

(71) Applicant: Intel Corporation, Santa Clara, CA (US)

(72) Inventors: Nita Chandrasekhar, Portland, OR (US); AKM Shaestagir Chowdhury, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/833,258

(22) Filed: Mar. 27, 2020

(65) Prior Publication Data

US 2021/0305161 A1    Sep. 30, 2021

(51) Int. Cl.
*H01L 23/532* (2006.01)
*H01L 23/528* (2006.01)
*H01L 23/522* (2006.01)
*H01L 21/02* (2006.01)
*H01L 21/768* (2006.01)

(52) U.S. Cl.
CPC .... *H01L 23/5329* (2013.01); *H01L 21/02115* (2013.01); *H01L 21/76807* (2013.01); *H01L 21/76826* (2013.01); *H01L 21/76831* (2013.01); *H01L 21/76843* (2013.01); *H01L 23/5226* (2013.01); *H01L 23/5283* (2013.01)

(58) Field of Classification Search
CPC ............. H01L 23/5329; H01L 23/5226; H01L 23/5283; H01L 21/02115; H01L 21/76843; H01L 21/76831; H01L 21/76807; H01L 21/76826
See application file for complete search history.

(56) References Cited

U.S. PATENT DOCUMENTS

| 10,741,493 | B2 * | 8/2020 | Chan | ................... | H01L 23/5283 |
| 2013/0113102 | A1 * | 5/2013 | Bao | ................... | H01L 21/76873 |
| | | | | | 257/751 |
| 2015/0140827 | A1 * | 5/2015 | Kao | ................... | H01L 21/76829 |
| | | | | | 438/704 |
| 2019/0214552 | A1 * | 7/2019 | Gajek | ..................... | G11C 11/15 |
| 2020/0051920 | A1 * | 2/2020 | Wu | ................... | H01L 21/76841 |
| 2021/0057335 | A1 * | 2/2021 | Yang | ................. | H01L 23/53252 |

\* cited by examiner

*Primary Examiner* — Karen Kusumakar
(74) *Attorney, Agent, or Firm* — Schwabe, Williamson & Wyatt, P.C.

(57) ABSTRACT

An integrated circuit structure, comprises a dielectric material having an opening therein, the opening defined by sides and a bottom. A graphene barrier material is conformal to the sides and the bottom of the opening, and a conductive metal over the graphene barrier material that fills at least a portion of a remainder of the opening in the dielectric material. The graphene barrier is formed by applying a non-hydrogen based plasma pretreatment to the dielectric surface, including the sides and the bottom of the opening, to substantially remove any passivation and provide an activated dielectric surface. A carbon-based precursor is exposed to the activated dielectric surface at less than approximately 400° C. to form the graphene barrier.

25 Claims, 8 Drawing Sheets

| Surface Binding Atom | BDE of CH2 eV (KJ/mol) | BDE of CH4 eV (KJ/mol) |
|---|---|---|
| SiO2-OH | 1.26 eV (121.9 KM/mol) | No absorption |
| SiO2-O | 5.58 eV (539.17 KJ/mol) | 0.63 eV (17.19 KJ/mol) |
| SiO2-Si | 3.1 eV (2999.16 KJ/mol) | 0.74 eV (20.07 KJ/mol) |

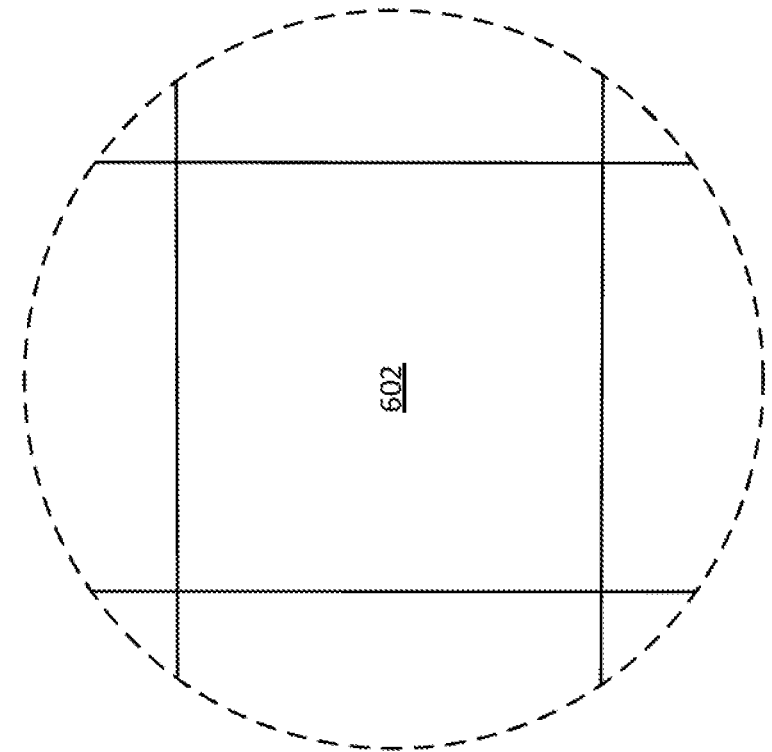
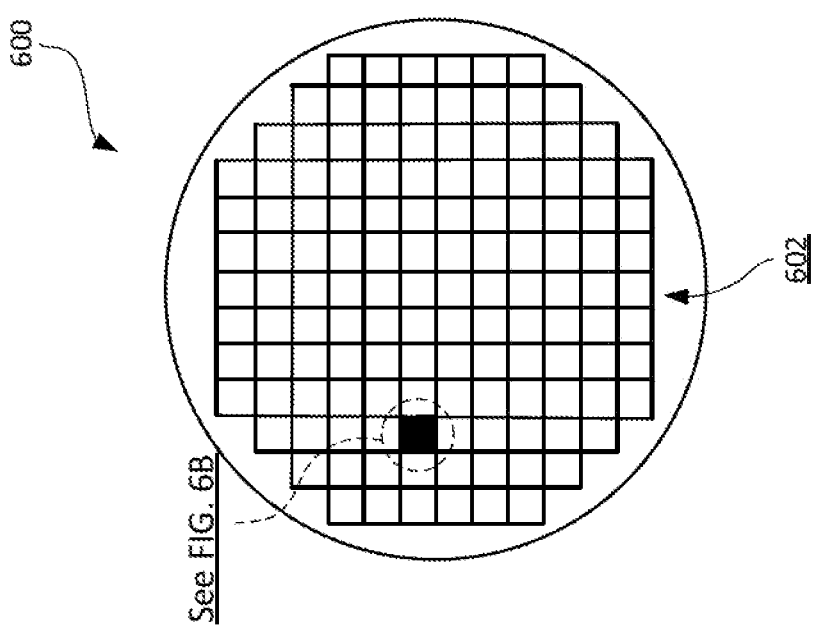
FIG. 6B
FIG. 6A

DEPOSITION OF GRAPHENE ON A DIELECTRIC SURFACE FOR NEXT GENERATION INTERCONNECTS

TECHNICAL FIELD

Embodiments of the disclosure are in the field of integrated circuit structures and, in particular, deposition of graphene on a dielectric surface for next generation interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant, such as for example, the fabrication of high-volume manufacturing (HVM) next generation interconnects.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 6A and 6B are top views of a wafer and dies that include one or more graphene barriers, in accordance with one or more of the embodiments disclosed herein.

DESCRIPTION OF THE EMBODIMENTS

Figure 1:
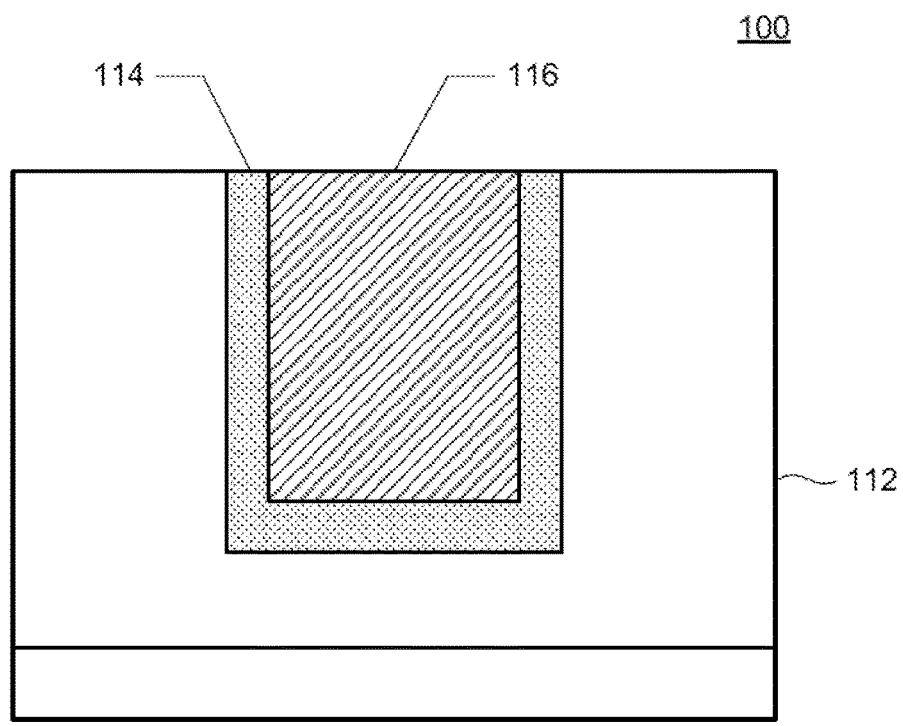
FIG. 1 illustrates a portion of an integrated circuit (IC) showing a cross-sectional view of a state of the art interconnect.

Deposition of graphene on a dielectric surface for next generation interconnects is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a BEOL processing scenario, such approaches may also be applicable to FEOL processing. Likewise, although an exemplary processing scheme may be illustrated using a FEOL processing scenario, such approaches may also be applicable to BEOL processing.

One or more embodiments described herein are directed to structures and architectures for fabricating next generation interconnects through deposition of a graphene barrier directly on a dielectric surface. The disclosed embodiments provide a method for depositing the graphene barrier in an opening of an inert dielectric material by applying a non-hydrogen based plasma pretreatment, such as a halogen plasma, to effectively activate the surface of the dielectric at less than 400° C. The activated surface of the dielectric is then exposed to a carbon-based precursor to form the graphene barrier, and the opening is then filled with a metal to form a conductive structure. Embodiments may include or pertain to one or more of interconnects, transistors, memories, and system-on-chip (SoC) technologies. One or more embodiments may be implemented to realize improved electrical properties and lower electromigration failures in SoCs of future technology nodes.

To provide context, FIG. 1 illustrates a portion of an integrated circuit (IC) 100 showing a cross-sectional view of a state-of-the-art interconnect 116. An interconnect is a structure used to electrically connect two or more circuit elements (such as transistors). Typically, the interconnect 116 is formed using a trench fill technique in which a trench formed in a dielectric material 112 is filled by a conformal deposition of a barrier (or liner) material 114 followed by deposition of a conductive metal that forms the interconnect 116. The dielectric material 112 may include primarily an oxide material, and the barrier material 114 is necessary to prevent the conductive metal from leaching through the oxide of the dielectric material 112 towards other structurers comprising the IC 100. In some applications, the barrier material 114 may comprise tantalum or tantalum nitride, and must be of sufficient thickness to prevent leaching. The thickness of the barrier material 114 may depend on the technique used to deposit the barrier material. For example, tantalum deposited using physical vapor deposition (PVD) may result in the barrier material 114 being 30-40 Angstroms in thickness, while deposition using atomic layer deposition (ALD) may result in the barrier material 114 being approximately 15 Angstroms in thickness.

To meet the continued decrease in the size if ICs, it is desirable to produce a relatively thinner barrier material layer for interconnects. Graphene has been considered for use as a barrier material, but for a copper interconnect, graphene must be deposited during the BEOL processing steps during the semiconductor manufacturing process. It is desirable, however, to perform graphene deposition at or below 400 C, which is compatible with BEOL processes. This results in two main challenges. The first challenge is that graphene deposition must currently be performed at higher temperatures (600-700° C.), which are unsuitable for deposition during FEOL processing which can withstand a maximum of approximately 400° C. to prevent damage to exposed materials. The second challenge is determining a process to deposit graphene on an inert dielectric on which interconnects are formed, which requires a pretreatment to enable the deposition process.

In its native form, oxide-based dielectric surfaces are passivated by a layer of hydroxyl (—OH) groups that are not reactive, rendering the surface inert to further deposition processes. To substantially remove the passivation, a hydrogen (H2)-based thermal pretreatment is commonly performed in which the surface is heated to high temperatures (~600-800° C.) or to an H2 based plasma treatment.

However, the use of hydrogen plasma to activate the inert surface has several drawbacks. One drawback is that the use of hydrogen plasma has very strict process control requirements with controlled doses of plasma. In addition, the kinetic effectiveness of the hydrogen plasma activation process is limited due to the need for high activation energy requiring higher temperatures for the activation of the inert surface sufficient for graphene deposition.

As an example, assume that a $H_2$ plasma pretreatment is used on a dielectric comprising SiO2. The ideal hydrogen plasma reaction is:

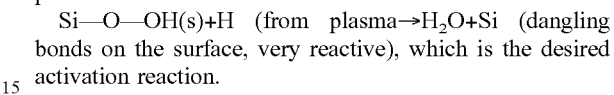

bonds on the surface, very reactive), which is the desired activation reaction.

However, a non-ideal hydrogen plasma reaction can result in an excess of $H_2$ plasma, which can re-passivate or make the surface inert again, negating the process goal. An excess H plasma reaction is:

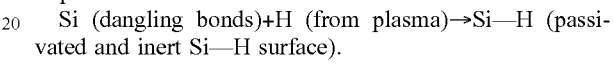

This is undesirable since a Si—H passivated surface is not reactive at low temperatures and is unsuitable for graphene deposition at a temperature less than 400° C. Consequently, use of $H_2$ plasma to activate the surface of the dielectric is not manufacturing worthy due to process sensitivity and control challenges.

According to the disclosed embodiments, a process for depositing graphene on a dielectric material is disclosed. More particularly, the disclosed embodiments are directed to improved activation of the passivated/inert dielectric surface using a halogen-based plasma activation process for subsequent graphene deposition. Halogen-based plasma activation resolves both the issues outlined above by making the dielectric surface more reactive, which in turn lowers the deposition temperature and enables deposition on less reactive surfaces. Accordingly, the processes of the disclosed embodiments enables deposition of graphene at relatively low temperatures of approximately 400° C., which is suitable for high-volume manufacturing of next generation interconnects.

Figure 2:
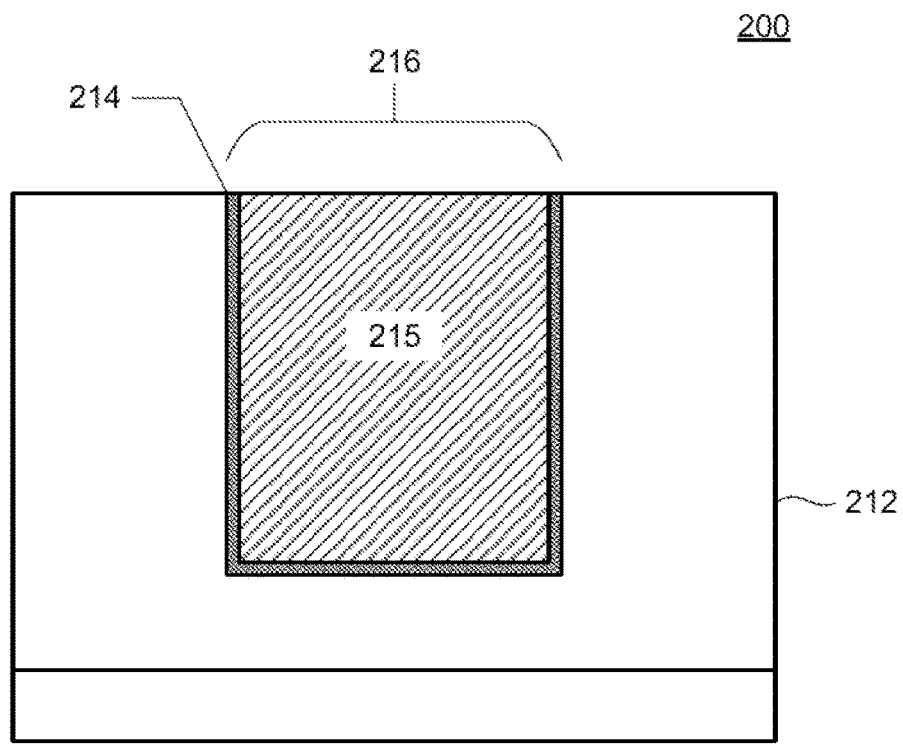
FIG. 2 illustrates a portion of an integrated circuit (IC) showing a cross-sectional view of an interconnect 216 fabricated in accordance with the disclosed embodiments.

FIG. 2 illustrates a portion of an integrated circuit (IC) 200 showing a cross-sectional view of an interconnect 216 fabricated in accordance with the disclosed embodiments. The IC 200 comprises a dielectric material 212 having an opening formed therein. A graphene barrier material 214 is conformal to sides and a bottom of the opening. A conductive metal 215 is over the graphene barrier material 214 to fill at least a portion of a remainder of the opening in the dielectric material 212. In embodiments, the graphene barrier material 214 is deposited directly on the dielectric material 212. In the example shown, the conductive metal 215 and the graphene barrier material 214 comprise an interconnect 216, but any other structure requiring a barrier material may be formed.

The graphene barrier material 214 is a few monolayer in thickness, e.g., less than 5 Angstroms, which is substantially thinner than conventional barriers/liners that are 15-40 Angstroms in thickness. The dielectric material 212 may include primarily an oxide material having characteristics of a low-k material. For example, a silicon dioxide (SiO2)-based dielectric is not normally a low-k material, but when carbon is added to lower the k value, the dielectric exhibits characteristics over a low-k material. Other example types of materials comprising the dielectric may include titanium nitride (TiN), silicon nitride ($Si_3N_4$) or other suitable dielectric material. The conductive metal material 215 may comprise any type of metal including cobalt, copper, titanium, aluminum or other suitable metal.

According to the disclosed embodiments, a method of fabricating an integrated circuit, such as an interconnect, comprises forming a dielectric material having an opening therein, the opening defined by sides and a bottom. A graphene barrier material is formed conformal to the sides and the bottom of the opening, and a conductive metal formed over the graphene barrier material fills at least a portion of a remainder of the opening in the dielectric material. This process is described in further detail below.

FIGS. 3A-3E illustrate a cross-section view showing a process for deposition of graphene on a dielectric surface during IC fabrication. In this embodiment, an interconnect fabrication process is shown, but the deposition process can be used during fabrication of any component of an IC that requires a graphene barrier.

Figure 3A:
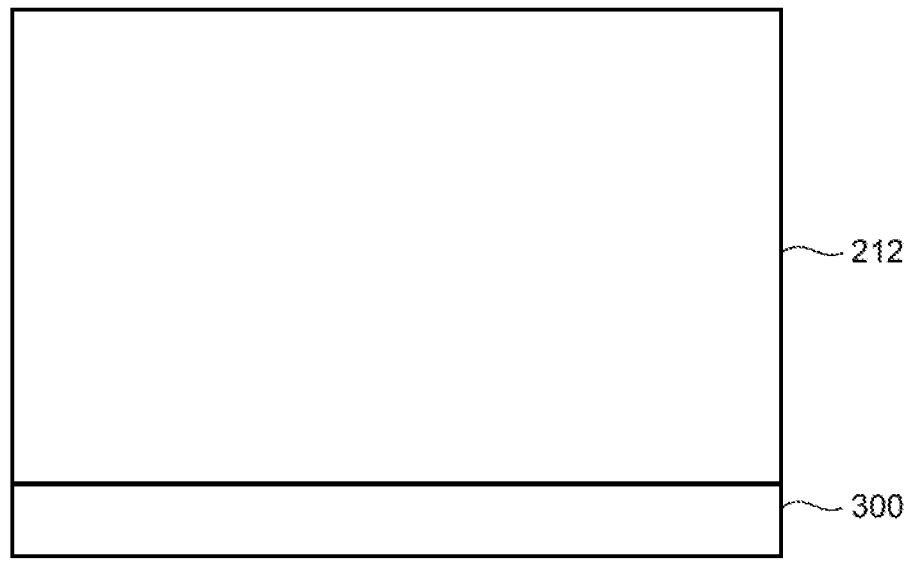
FIGS. 3A-3E illustrate a cross-section view showing a process for deposition of graphene on a dielectric surface during IC fabrication.

FIG. 3A illustrates the process after a dielectric material 212 is formed over a substrate 300 or over a metal structure.

Figure 3B:
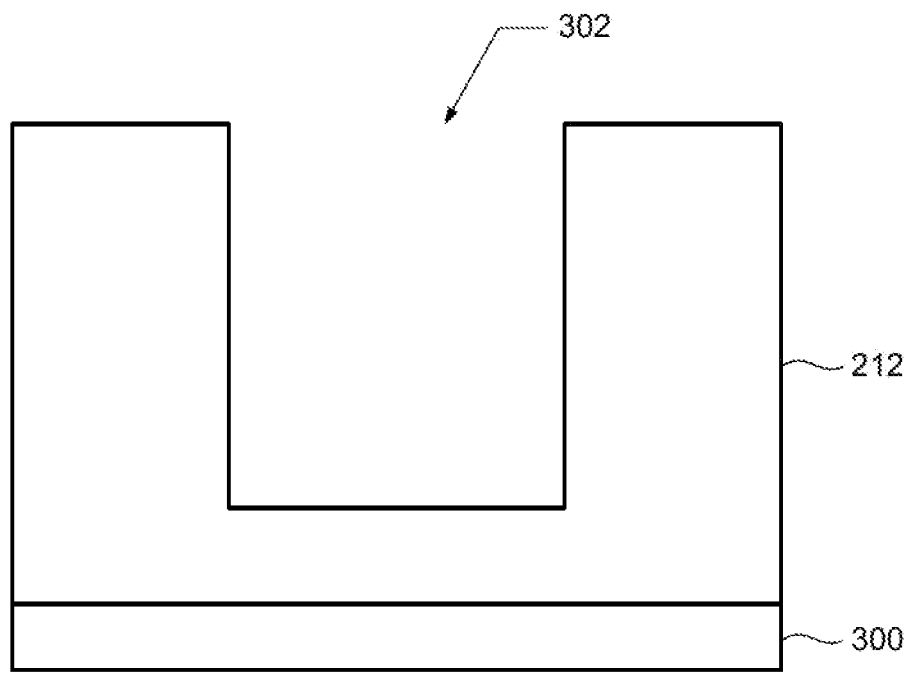

FIG. 3B illustrates the process after an opening 302 is formed in the dielectric material 212. In some embodiments, the opening 302 may be referred to as a trench or a via. For example, to form an interconnect, a dielectric layer is deposited and etched to form a pattern of openings or trenches (and/or vias). In one embodiment, the opening 302 may be formed by providing a damascene or a dual damascene structure. Surfaces of the dielectric materials are typically inert and not reactive to incoming carbon-based precursors, thus requiring elevated temperatures of ~600-700° C. for graphene deposition, which are not suitable during front-end processing where the material stack can withstand a maximum of ~400° C.

Figure 3C:
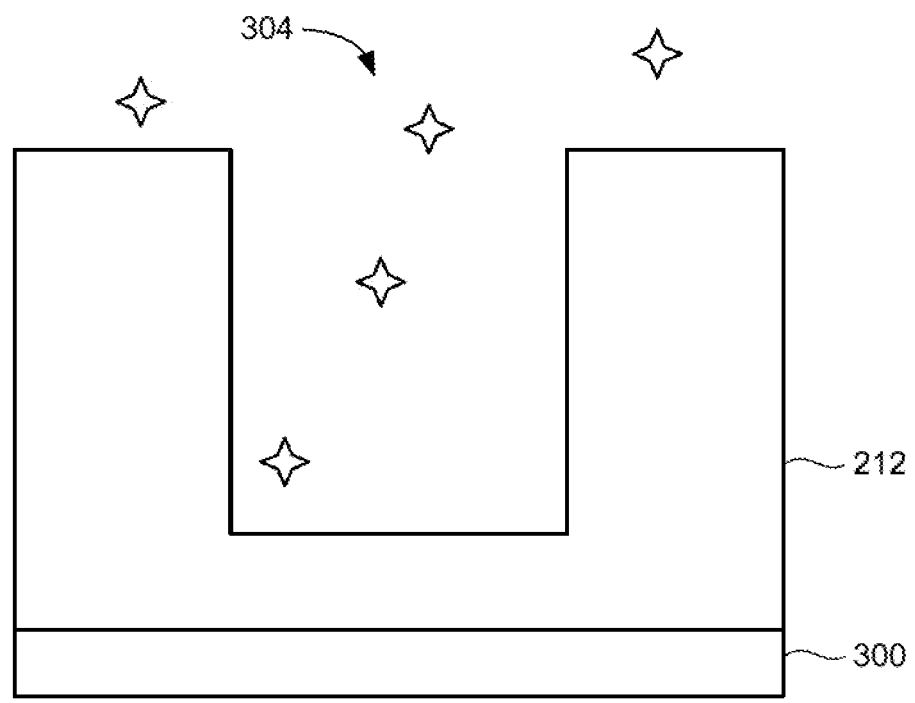

FIG. 3C illustrates the process during application of plasma pretreatment of the disclosed embodiments in which a non-hydrogen based plasma 304 is applied to the surface of the dielectric material 212 to substantially remove any passivation and provide an activated dielectric surface. As shown the non-hydrogen based plasma 304 is applied to a top surface of the dielectric material 212, including the sides and bottom of the opening 302.

According to one embodiment, the non-hydrogen plasma pretreatment acts as an activation process based on use of a halogen plasma to substantially remove any passivation (e.g., —OH) present on the dielectric surface prior to graphene deposition. This activation is required for deposition of graphene at lower temperatures. Activation of the surface of the dielectric material 212 using halogen plasma results in a reactive surface with O dangling bonds that bind to the incoming carbon-based precursor promoting growth on oxide surfaces. The energy barrier of surface activation is 2.3× lower using the disclosed process as compared to the conventional hydrogen plasma activation process allowing the present process to occur at lower temperatures.

In one embodiment, the non-hydrogen based plasma 304 comprises a halogen-based plasma. Example types of halogen-based plasma that may be used include fluorine (e.g., F2), chlorine (e.g., Cl2), bromine (e.g., Br2), or hydrogen bromide (HBr), and plasmas containing halogen such as sulfur tetrafluoride (e.g., SF6), nitrogen trifluoride (NF3), fluoromethylene (CHxFy), or chloromethylene (CHxCly). In other embodiments, the non-hydrogen based plasma 304 may comprise a fluorocarbon plasma (CFx), a chlorocarbon plasma (CClx), a carbon-halogen plasma, or a chlorofluoro plasma (ClF3).

In the embodiment where the chlorine (Cl)-based plasma is used as the activation pretreatment, the CL-based plasma reacts with hydrogen (H) on the surface of the dielectric material 212 to form volatile byproducts such as hydrogen chloride (HCL), and oxygen (O) dangling bonds. Post Cl exposure, O dangling bonds remain on the surface of the dielectric material 212. The O dangling bonds are extremely reactive and bind very strongly to the incoming precursors. If excess of Cl plasma is used and the surface is now Cl terminated, the dangling bonds can continue to react with the incoming carbon-based precursors and form graphene under process conditions. This is not the case where H-based plasmas are used and over-exposure to the plasma negates the activation such that no film can be grown at lower temperatures.

Figure 3D:
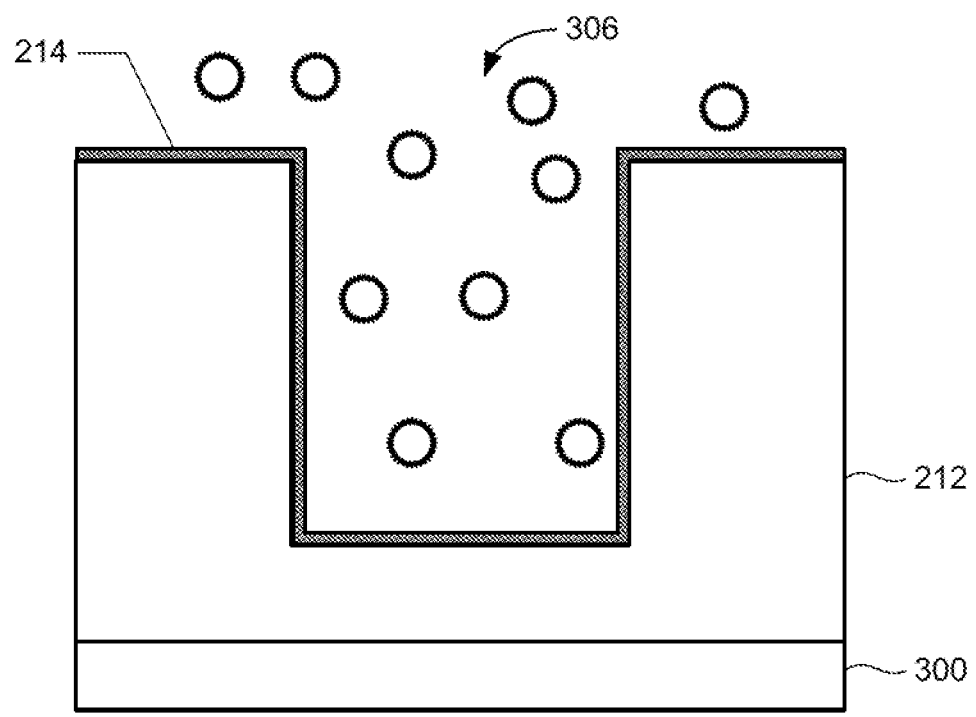

FIG. 3D illustrates the process during the exposure of a carbon-based precursor 306 to the surface of the dielectric material 212 at less than approximately 400° C. to form a graphene barrier 214 conformal to the surface of the dielectric material 212. In one embodiment, the carbon-based precursor 306 may comprise any source of carbon atoms suitable for forming a graphene barrier including, alkane, alkene, alkynes, cyclic hydrocarbons, aromatic carbon compounds, hydrocarbons, and the like. Assuming the dielectric material 212 is oxide-based, optimal activation of the dielectric surface by non-hydrogen based plasma results in a reactive surface with either Si or O dangling bonds that bind to the incoming carbon-based precursor promoting growth on the oxide-based dielectric surface.

Figures 3E, 4:
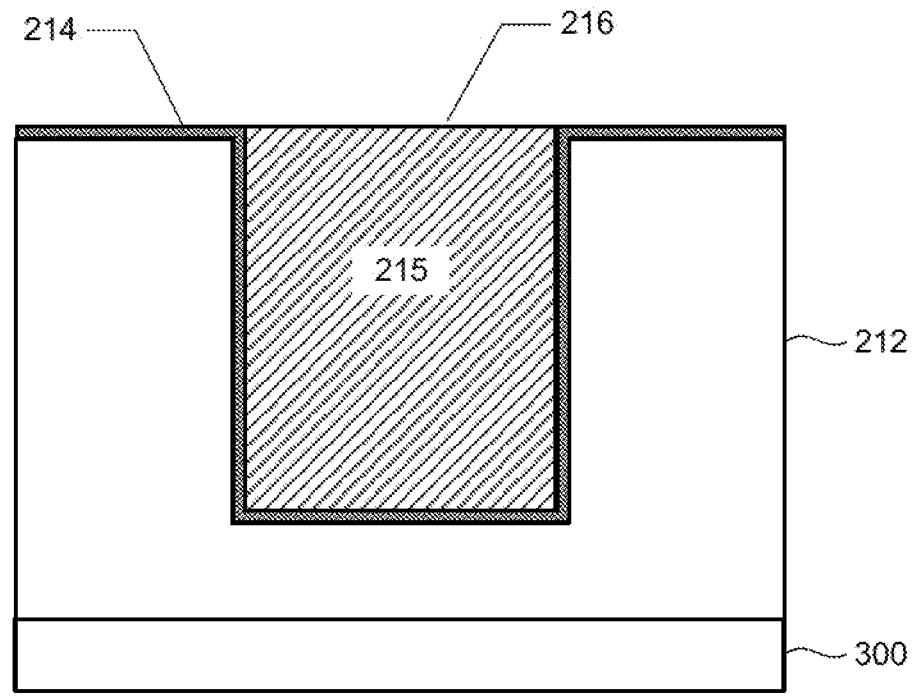
FIG. 4 shows a table comparing bond disassociation energy (BDE) or binding strength of a halogen-based precursor (CH4) and reactive fragment (CH2), on a passivated and an activated dielectric comprising SiO2.

FIG. 3E illustrates a process after conductive metal 215 is deposited over the graphene barrier 214 to form a conductive structure, such as an interconnect 216. In this example, the graphene barrier 214 remains on a top surface of the dielectric material 212 and the conductive metal 215 is planarized level with the graphene barrier 214.

It should be noted that should the above process be performed incorrectly, a cross-section of the resulting structure could show the presence of halogen atom contamination over the dielectric material.

The methods provided herein also may include one or more additional features, such as annealing the interconnect 216, polishing the metal interconnect 216, removing one or more portions of the layer(s) and/or material(s) deposited outside of a damascene or dual damascene structure, or combination thereof. When the methods provided herein include depositing an overburden, the methods may also include annealing the interconnect, polishing the overburden, or annealing the metal interconnect and polishing the overburden. The polishing may be achieved by any known technique, such as chemical mechanical planarization (CMP).

The use of graphene as a barrier material provides improved electrical properties and lower electromigration failures among other benefits. This method can enable development of the next generation of interconnect technology using scalable HVM processes. With rapidly decreasing feature size, liner thickness becomes critical in achieving device density and performance. Currently used barrier/liner materials are thick and impede the amount of metal that can be deposited in the trench. The disclosed HVM capable method enables the deposition of thinner graphene based liners in the trench on oxides within thermal budget resulting in development of the next interconnect technology.

As described above, the energy barrier of surface activation is 2.3× lower using the disclosed process as compared to the conventional plasma activation process allowing the present process to occur at lower temperatures.

FIG. 4 shows a table comparing bond disassociation energy (BDE) or binding strength of a carbon based precursor—methane CH4, and a methylene (CH2) reactive fragment, which participates in the graphene deposition process, on a passivated and an activated dielectric comprising SiO2. When the carbon precursor CH4 is deposited, the precursor reacts with the dielectric surface and breaks down, resulting in the reactive fragment CH2. It is important to determine how both the precursor CH4 and its fragments CH2 bond to the dielectric surface under different passivation conditions.

The binding energy is calculated for three types of oxide dielectric surfaces shown in the first column—passivated (SiO2-OH), activated SiO2 with O-dangling bonds (SiO2-O) and activated SiO2 with Si-dangling bonds (SiO2-Si). The second column shows the BDE of CH2 for three types of oxide dielectric surfaces, and the third column shows the BDE of CH4 for three types of oxide dielectric surfaces. The table of FIG. 4 shows that stronger binding between precursors and surfaces occurs on activated dielectric surfaces, necessitating surface activation of dielectrics prior to graphene deposition. The BDE of CH2 is highest on SiO2-O at 5.58 eV, and the BDE of CH4 is highest on SiO2-Si at 0.74 eV. From the Table, it is clear that: i) dielectric surfaces need to be activated with the halogen-based precursor prior to graphene deposition as seen by the weak binding energy of the reactive CH2 fragment and the negligible surface attachment of the CH4 molecule on the SiO2-OH passivated surface, ii) both SiO2-O and SiO2-Si dangling bonds show considerably higher bond strength to the CH2 fragment and the CH4 precursor enabling the graphene deposition process at temperature less than approximately 400° C.

Figure 5A:
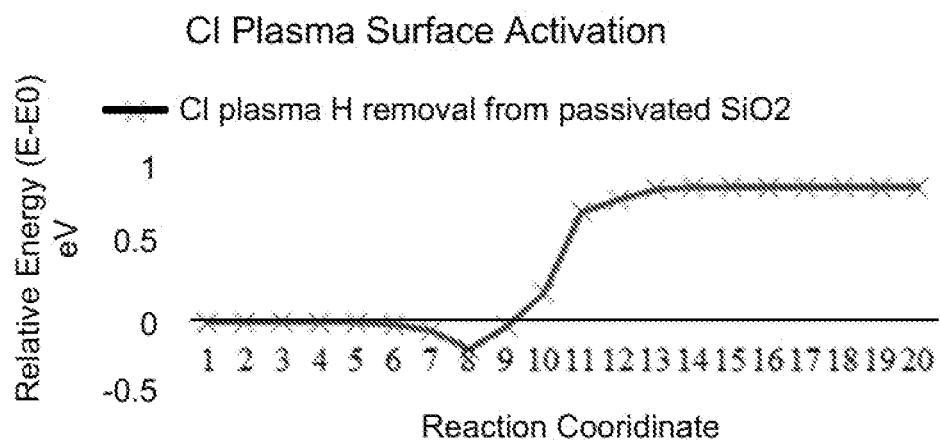
FIG. 5A shows a plot of relative energy requirements as a function of the reaction coordinate during activation of the SiO2 dialectic surface using a chlorine (Cl)-based plasma to substantially remove the inert H.

As another example, FIG. 5A shows a plot of relative energy requirements as a function of the reaction coordinate during activation of the SiO2 dielectric surface using a chlorine (Cl)-based plasma to substantially remove the inert H. Once Cl atoms reach the dielectric surface, HCl is formed leaving behind a dangling O bond. The energy barrier of this reaction is 0.91 eV, which is 2.3× lower than that when a conventional H plasma is used.

Figure 5B:
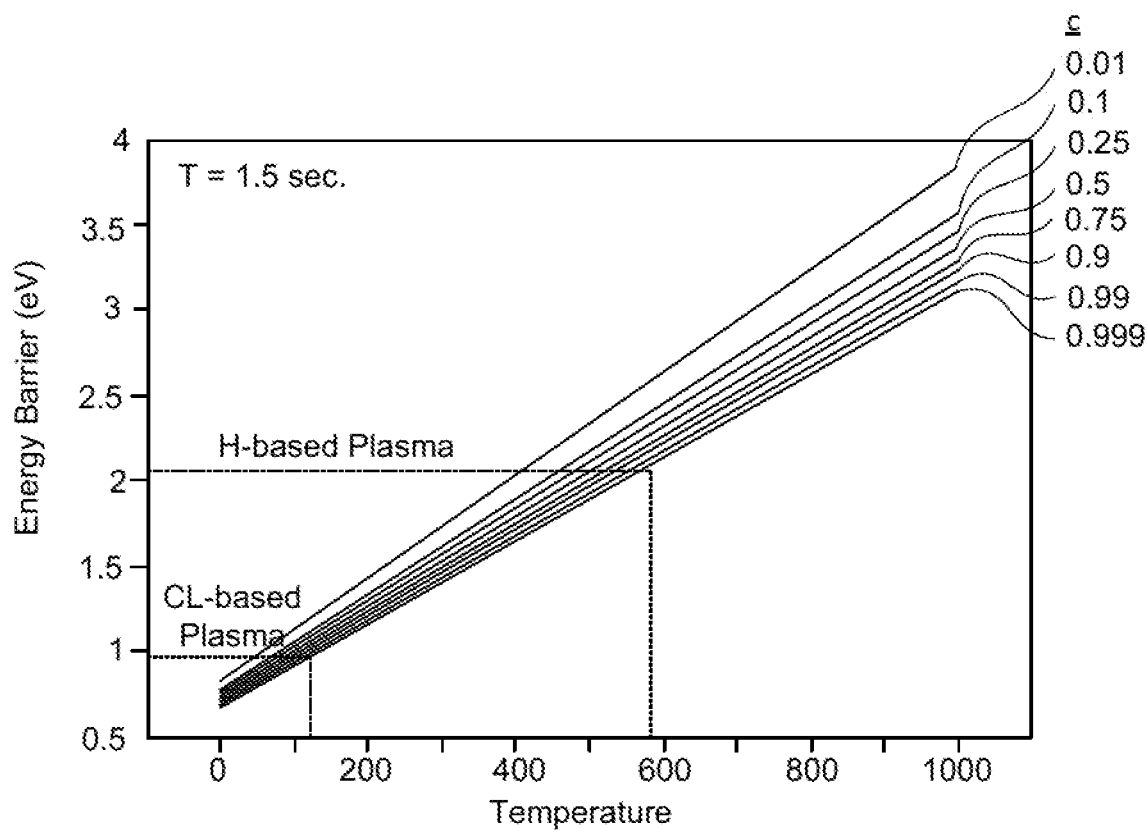
FIG. 5B illustrates an energy barrier vs. temperature plot that shows approximately what energy barriers can be overcome at different temperatures during dielectric surface activation.

FIG. 5B illustrates an energy barrier vs. temperature plot that shows approximately what energy barriers can be overcome at different temperatures during dielectric surface activation. The Cl based activation process can occur at temperatures between 100-200 C enabling applicability in low temperature processes. The plot translates activation energy barriers predicted using DFT/NEB calculations into temperatures where they can be overcome using a combination of Arrhenius rate law, first order kinetics and equations of half-life. The plot shows for ~1.5 second reaction time for different reaction completion extents (c)—that ranges from 0.01 to 99%. To help understand this plot, dashed lines indicating the activation energy barrier of Cl-based plasma (0.91 eV) vs H-based plasma (>2) are shown. It is expected that at ~110-120° C., these barriers can be overcome thermally. This plot is a useful tool to understand how the activation energies play a role in determining the feasibility of the reaction at a given temperature. The proposed Cl based plasma activation method is suitable for low temperature (<400° C.) applications.

The feasibility of a halogen-based (e.g., Cl) plasma for activation of surfaces prior to graphene deposition has been demonstrated. Cl-based plasmas offer faster surface reactions and a larger window for process control. Also, unlike excess H, excess Cl on the surface will react with the incoming carbon-based precursors and form volatile products which then leave the target surface and will not stay in the films impacting subsequent metal deposition processes. Excess of Cl is not prohibitive to graphene growth as is excess H plasma, which results in the formation of stable Si—H bonds (3.1 eV/71.4 kcal/mol) and is inert to incoming reactants. Excess Cl will result in a slower deposition rate initially due to reactions with carbon-based precursor but will not impede the deposition process. This key factor in addition to the 2.3× lower activation energy barriers make Cl based surface pretreatment an attractive option to enable oxide activation prior to deposition at low temperatures. Other halogens such as F can be substituted for this application. Halogen-based (F/Cl) oxide surface activation is required as a pre-treatment step to enable graphene deposition at lower processing temperatures.

The integrated circuit structures described herein may be included in an electronic device. As an example of one such apparatus, FIGS. 6A and 6B are top views of a wafer and dies that include one or more graphene barriers, in accordance with one or more of the embodiments disclosed herein.

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more graphene barriers, such as described above). After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
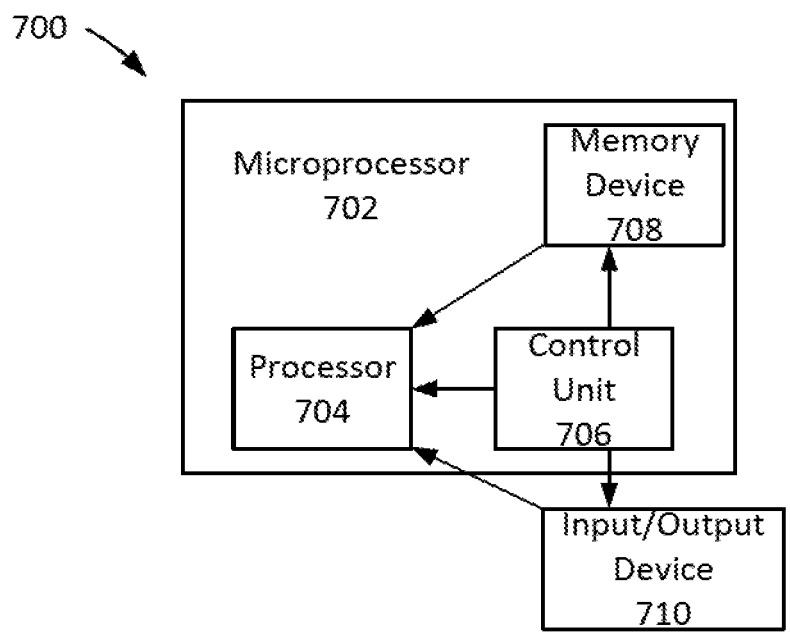
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more graphene barriers, such as those described herein.

Figure 8:
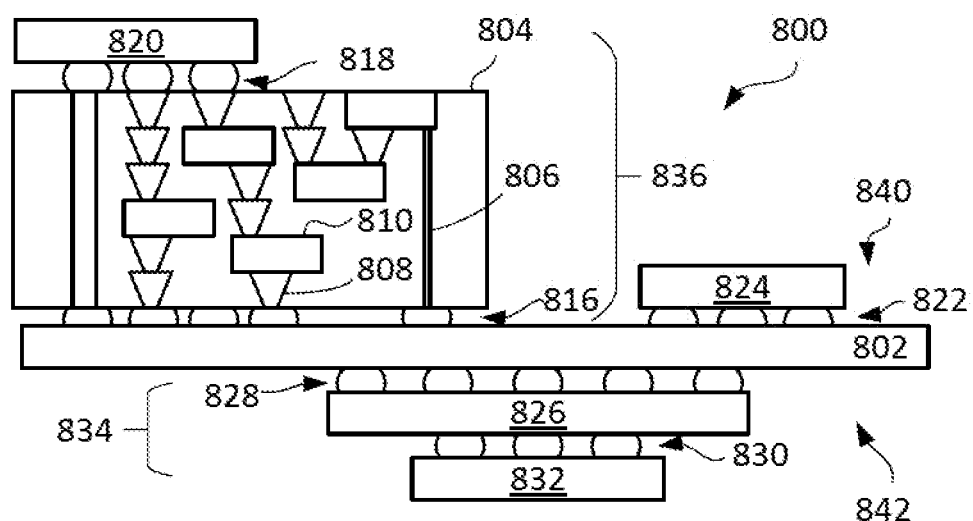
FIG. 8 is a cross-sectional side view of an integrated circuit (IC) device assembly that may include one or more graphene barriers, in accordance with one or more of the embodiments disclosed herein.

FIG. 8 is a cross-sectional side view of an integrated circuit (IC) device assembly that may include one or more graphene barriers, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of graphene barriers, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 602 of FIG. 6B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
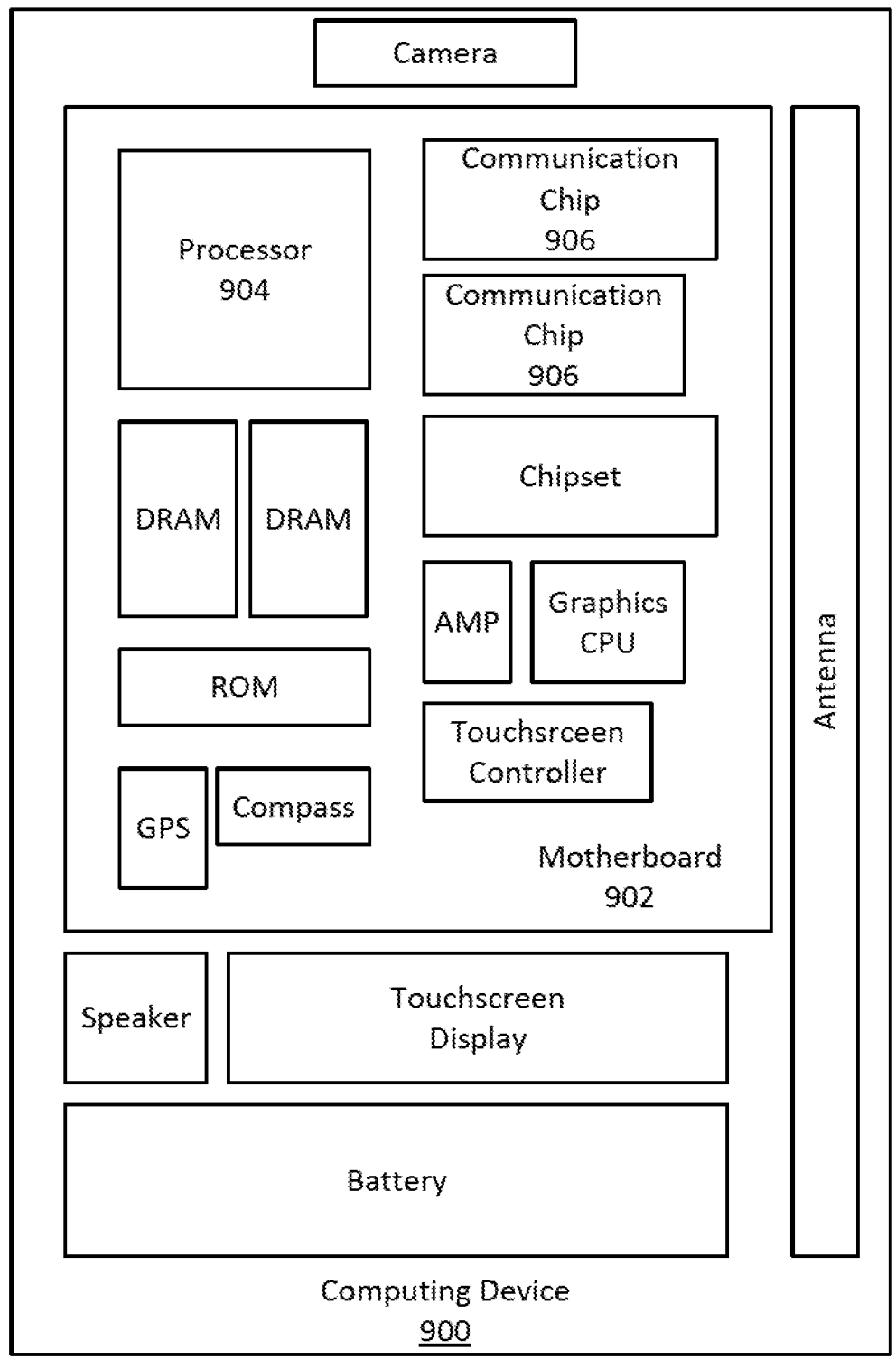
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more graphene barriers, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip 906 includes one or more graphene barriers, in accordance with implementations of embodiments of the disclosure.

In further implementations, another component housed within the computing device 900 may contain an integrated circuit die that includes one or more graphene barriers, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include graphene barriers directly formed on a dielectric surface with a conductive metal directly on the graphene barriers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure, comprises a dielectric material having an opening therein, the opening defined by sides and a bottom. A graphene barrier material is conformal to the sides and the bottom of the opening, and a conductive metal over the graphene barrier material that fills at least a portion of a remainder of the opening in the dielectric material.

Example Embodiment 2

The integrated circuit structure of example embodiment 1, wherein the graphene barrier material is directly on the dielectric material.

Example Embodiment 3

The integrated circuit structure of embodiment 1, wherein the graphene barrier material is less than approximately 5 Angstroms in thickness.

Example Embodiment 4

The integrated circuit structure of embodiment 1, wherein the conductive metal and the graphene barrier material comprise a conductive structure.

Example Embodiment 5

The integrated circuit structure of embodiment 1, wherein the conductive structure comprises an interconnect.

Example Embodiment 6

The integrated circuit structure of embodiment 1, wherein the dielectric material comprise an oxide-based material having characteristics of a low-k material.

Example Embodiment 7

A method of fabricating an integrated circuit, the method comprising forming a dielectric material having an opening therein, the opening defined by sides and a bottom. A graphene barrier material is formed conformal to the sides and the bottom of the opening. A conductive metal is formed over the graphene barrier material fills at least a portion of a remainder of the opening in the dielectric material.

Example Embodiment 8

The method of embodiment 7, further comprising: forming the graphene barrier to a thickness less than approximately 5 Ångströms.

Example Embodiment 9

The method of embodiment 7, wherein forming the graphene barrier material conformal to the sides and the bottom of the opening further comprises: applying a non-hydrogen based plasma pretreatment to a surface of the dielectric material, including the sides and the bottom of the opening, to substantially remove any passivation and provide an activated dielectric surface.

Example Embodiment 10

The method of embodiment 9, further comprising, applying a halogen-based plasma as the non-hydrogen based plasma.

Example Embodiment 11

The method of embodiment 10, wherein the halogen-based plasma comprises one of: fluorine, chlorine, bromine, hydrogen bromide, sulfur tetrafluoride, nitrogen trifluoride, fluoromethylene or chloromethylene.

Example Embodiment 12

The method of embodiment 9, further comprising, applying as the non-hydrogen based plasma one of: a fluorocarbon plasma, a chlorocarbon plasma, a carbon-halogen plasma, or a chlorofluoro plasma.

Example Embodiment 13

The method of embodiment 9, further comprising: exposing a carbon-based precursor to the activated dielectric surface at less than approximately 400° C. to form the graphene barrier.

Example Embodiment 14

The method of embodiment 13, wherein the carbon-based precursor comprises a source of carbon atoms, the source of carbon atoms including one of: alkane, alkene, alkynes, cyclic hydrocarbons, aromatic carbon compounds, or hydrocarbons.

Example Embodiment 15

The method of embodiment 9, further comprising: applying a chlorine-based plasma such that the chlorine-based plasma reacts with hydrogen on the surface of the dielectric material to form a hydrogen chloride byproduct and oxygen dangling bonds, wherein the dangling bonds remain on the surface of the dielectric material and bind with a carbon-based precursor.

Example Embodiment 16

The method of embodiment 7, further comprising: forming the dielectric material to create a damascene or a dual damascene structure.

Example Embodiment 17

The method of embodiment 7, further comprising: forming the dielectric material as oxide-based material having characteristics of a low-k material.

Example Embodiment 18

A method for activating a dielectric surface for graphene deposition, the method comprising forming a dielectric material over a substrate or a metal structure. An opening is formed in the dielectric material, the opening defined by sides and a bottom. A non-hydrogen based plasma pretreatment is applied to the dielectric surface, including the sides and the bottom of the opening, to substantially remove any passivation and provide an activated dielectric surface. A carbon-based precursor is exposed to the activated dielectric surface at less than approximately 400° C. to form a graphene barrier conformal to the dielectric surface. A conductive metal is deposited over the graphene barrier to form a conductive structure.

Example Embodiment 19

The method of embodiment 18, wherein exposing the carbon-based precursor to the activated dielectric surface further comprises: forming the graphene barrier to a thickness less than approximately 5 Angstroms.

Example Embodiment 20

The method of embodiment 18, further comprising, applying a halogen-based plasma as the non-hydrogen based plasma.

Example Embodiment 21

The method of embodiment 20, wherein the halogen-based plasma comprises one of: fluorine, chlorine, bromine, hydrogen bromide, sulfur tetrafluoride, nitrogen trifluoride, fluoromethylene or chloromethylene.

Example Embodiment 22

The method of embodiment 18, further comprising, applying as the non-hydrogen based plasma one of: a fluorocarbon plasma, a chlorocarbon plasma, a carbon-halogen plasma, or a chlorofluoro plasma.

Example Embodiment 23

The method of embodiment 20, further comprising: applying a chlorine-based plasma such that the chlorine-based plasma reacts with hydrogen on the dielectric surface to form a hydrogen chloride byproduct and oxygen dangling bonds, wherein the dangling bonds remain on the dielectric surface and bind with the carbon-based precursor.

Example Embodiment 24

The method of embodiment 18, wherein the carbon-based precursor comprises a source of carbon molecules, the source of carbon molecules including one of: alkane, alkene, alkynes, cyclic hydrocarbons, aromatic carbon compounds, or hydrocarbons.

Example Embodiment 25

The method of embodiment 18, wherein the dielectric is oxide-based and activation of the dielectric surface by non-hydrogen based plasma results in a reactive surface with either Si or O dangling bonds that bind to the carbon-based precursor promoting growth on the oxide-based dielectric surface.

What is claimed is:

1. An integrated circuit structure, comprising:
   a dielectric material having an opening therein, the opening defined by sides and a bottom;
   a graphene barrier material conformal to the sides and the bottom of the opening; and
   a conductive metal over the graphene barrier material that fills at least a portion of a remainder of the opening in the dielectric material, the conductive metal in direct contact with the graphene barrier material along the sides and the bottom of the opening.

2. The integrated circuit structure of claim 1, wherein the graphene barrier material is directly on the dielectric material.

3. The integrated circuit structure of claim 1, wherein the graphene barrier material is less than approximately 5 Angstroms in thickness.

4. The integrated circuit structure of claim 1, wherein the conductive metal and the graphene barrier material comprise a conductive structure.

5. The integrated circuit structure of claim 1, wherein the conductive structure comprises an interconnect.

6. The integrated circuit structure of claim 1, wherein the dielectric material comprise an oxide-based material having characteristics of a low-k material.

7. A method of fabricating an integrated circuit, the method comprising:
   forming a dielectric material having an opening therein, the opening defined by sides and a bottom;
   forming a graphene barrier material conformal to the sides and the bottom of the opening; and
   forming a conductive metal over the graphene barrier material fills at least a portion of a remainder of the opening in the dielectric material, the conductive metal in direct contact with the graphene barrier material along the sides and the bottom of the opening.

8. The method of claim 7, further comprising: forming the graphene barrier to a thickness less than approximately 5 Ångströms.

9. The method of claim 7, wherein forming the graphene barrier material conformal to the sides and the bottom of the opening further comprises: applying a non-hydrogen based plasma pretreatment to a surface of the dielectric material, including the sides and the bottom of the opening, to substantially remove any passivation and provide an activated dielectric surface.

10. The method of claim 9, further comprising, applying a halogen-based plasma as the non-hydrogen based plasma.

11. The method of claim 10, wherein the halogen-based plasma comprises one of: fluorine, chlorine, bromine, hydrogen bromide, sulfur tetrafluoride, nitrogen trifluoride, fluoromethylene or chloromethylene.

12. The method of claim 9, further comprising, applying as the non-hydrogen based plasma one of: a fluorocarbon plasma, a chlorocarbon plasma, a carbon-halogen plasma, or a chlorofluoro plasma.

13. The method of claim 9, further comprising: exposing a carbon-based precursor to the activated dielectric surface at less than approximately 400° C. to form the graphene barrier.

14. The method of claim 13, wherein the carbon-based precursor comprises a source of carbon atoms, the source of carbon atoms including one of: alkane, alkene, alkynes, cyclic hydrocarbons, aromatic carbon compounds, or hydrocarbons.

15. The method of claim 9, further comprising: applying a chlorine-based plasma such that the chlorine-based plasma reacts with hydrogen on the surface of the dielectric material to form a hydrogen chloride byproduct and oxygen dangling bonds, wherein the dangling bonds remain on the surface of the dielectric material and bind with a carbon-based precursor.

16. The method of claim 7, further comprising: forming the dielectric material to create a damascene or a dual damascene structure.

17. The method of claim 7, further comprising: forming the dielectric material as oxide-based material having characteristics of a low-k material.

18. A method for activating a dielectric surface for graphene deposition, the method comprising:
   forming a dielectric material over a substrate or a metal structure;
   forming an opening in the dielectric material, the opening defined by sides and a bottom;
   applying a non-hydrogen based plasma pretreatment to the dielectric surface, including the sides and the bottom of the opening, to substantially remove any passivation and provide an activated dielectric surface;
   exposing a carbon-based precursor to the activated dielectric surface at less than approximately 400° C. to form a graphene barrier conformal to the dielectric surface; and
   depositing a conductive metal over the graphene barrier to form a conductive structure.

19. The method of claim 18, wherein exposing the carbon-based precursor to the activated dielectric surface further comprises: forming the graphene barrier to a thickness less than approximately 5 Angstroms.

20. The method of claim 18, further comprising, applying a halogen-based plasma as the non-hydrogen based plasma.

21. The method of claim 20, wherein the halogen-based plasma comprises one of: fluorine, chlorine, bromine, hydrogen bromide, sulfur tetrafluoride, nitrogen trifluoride, fluoromethylene or chloromethylene.

22. The method of claim 18, further comprising, applying as the non-hydrogen based plasma one of: a fluorocarbon plasma, a chlorocarbon plasma, a carbon-halogen plasma, or a chlorofluoro plasma.

23. The method of claim 20, further comprising: applying a chlorine-based plasma such that the chlorine-based plasma reacts with hydrogen on the dielectric surface to form a hydrogen chloride byproduct and oxygen dangling bonds, wherein the dangling bonds remain on the dielectric surface and bind with the carbon-based precursor.

24. The method of claim 18, wherein the carbon-based precursor comprises a source of carbon molecules, the source of carbon molecules including one of: alkane, alkene, alkynes, cyclic hydrocarbons, aromatic carbon compounds, or hydrocarbons.

25. The method of claim 18, wherein the dielectric is oxide-based and activation of the dielectric surface by non-hydrogen based plasma results in a reactive surface with either Si or O dangling bonds that bind to the carbon-based precursor promoting growth on the oxide-based dielectric surface.

* * * * *